(12) United States Patent
Kuma et al.

(10) Patent No.: US 7,843,134 B2
(45) Date of Patent: Nov. 30, 2010

(54) ORGANIC EL EMISSION DEVICES CONNECTED IN SERIES

(75) Inventors: Hitoshi Kuma, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 11/268,559

(22) Filed: Nov. 8, 2005

(65) Prior Publication Data
US 2007/0159085 A1 Jul. 12, 2007

(30) Foreign Application Priority Data
Oct. 31, 2005 (JP) ............................ 2005-316490

(51) Int. Cl.
H01L 51/00 (2006.01)
H01L 51/50 (2006.01)
H01L 51/52 (2006.01)

(52) U.S. Cl. ................. 313/509; 313/503; 313/504; 313/506

(58) Field of Classification Search ......... 313/302–312, 313/631, 326, 630, 634, 498–512
See application file for complete search history.

(56) References Cited

U.S. PATENT DOCUMENTS

| | | | |
|---|---|---|---|
| 4,754,544 A * | 7/1988 | Hanak | 438/66 |
| 6,107,734 A * | 8/2000 | Tanaka et al. | 313/506 |
| 6,185,038 B1 * | 2/2001 | Yamaguchi et al. | 359/457 |
| 6,566,824 B2 * | 5/2003 | Panagotacos et al. | 315/291 |
| 6,661,029 B1 * | 12/2003 | Duggal | 257/89 |
| 6,787,987 B2 * | 9/2004 | Duineveld et al. | 313/500 |
| 6,800,999 B1 * | 10/2004 | Duggal et al. | 315/169.1 |
| 6,856,365 B2 * | 2/2005 | Uchida et al. | 349/112 |
| 6,917,396 B2 * | 7/2005 | Hiraishi et al. | 349/64 |
| 7,102,282 B1 * | 9/2006 | Yamada et al. | 313/506 |
| 7,122,398 B1 * | 10/2006 | Pichler | 438/66 |
| 7,166,959 B2 * | 1/2007 | Suzuki et al. | 313/504 |
| 7,227,305 B2 * | 6/2007 | Liu et al. | 313/506 |
| 7,339,559 B2 * | 3/2008 | Yokoyama | 345/76 |
| 7,462,984 B2 * | 12/2008 | Handa et al. | 313/503 |
| 2004/0017335 A1 * | 1/2004 | Kobayashi et al. | 345/82 |
| 2004/0021425 A1 | 2/2004 | Foust et al. | 315/169.3 |
| 2004/0032220 A1 | 2/2004 | Cok et al. | 315/291 |
| 2005/0018303 A1 * | 1/2005 | Harada | 359/613 |
| 2005/0155704 A1 * | 7/2005 | Yokajty et al. | 156/295 |
| 2005/0174064 A1 * | 8/2005 | Agostinelli et al. | 315/169.3 |
| 2006/0108913 A1 * | 5/2006 | Cok | 313/500 |
| 2006/0186803 A1 * | 8/2006 | Lim et al. | 313/506 |
| 2008/0001512 A1 * | 1/2008 | Nomura | 313/307 |

FOREIGN PATENT DOCUMENTS

EP 416876 A2 * 3/1991

(Continued)

*Primary Examiner*—Sikha Roy
*Assistant Examiner*—Jose M Diaz
(74) *Attorney, Agent, or Firm*—Steptoe & Johnson LLP

(57) ABSTRACT

An organic electroluminescent apparatus including: a first emitting device having a first organic emitting layer between a first under electrode and a first upper electrode, and a second emitting device wherein a second organic emitting layer between a second under electrode and a second upper electrode. The second under electrode is electrically connected to the first upper electrode or is made of the same material as the first upper electrode. The two devices are placed on a common surface, yet the two devices exhibit different emission colors.

6 Claims, 14 Drawing Sheets

FOREIGN PATENT DOCUMENTS

| | | |
|---|---|---|
| EP | 1154676 A1 * | 11/2001 |
| EP | 1182910 A1 * | 2/2002 |
| JP | 11-329748 | 11/1999 |
| JP | 2000-058264 | 2/2000 |
| JP | 2001-313172 | 11/2001 |
| JP | 2002-272857 | 9/2002 |
| JP | 2003-045676 | 2/2003 |
| JP | 2004-006165 | 1/2004 |
| JP | 2004-134385 | 4/2004 |
| JP | 2004-342614 | 12/2004 |
| WO | WO 01/39554 | 5/2001 |
| WO | WO 2006030719 A1 * | 3/2006 |

* cited by examiner

ORGANIC EL EMISSION DEVICES CONNECTED IN SERIES

The invention relates to an organic electroluminescence (EL) apparatus which is operable low at total driving voltage and emits excellent whiteness uniformity.

BACKGROUND

Organic EL devices have the following characteristics: (i) the devices are spontaneously emitting devices, (ii) the devices can be driven by low direct current voltage, and (iii) various emission colors, such as red, green, blue and white, can be realized by selecting an organic EL material to be used or the structure of the devices. In recent years, therefore, attention has been paid to the devices as not only a next generation display technique but also a large-area illumination technique.

The structure of an organic EL devices is roughly classified into bottom emission types and top emission types. The bottom emission type has a structure wherein a transparent electrode made of indium tin oxide (ITO) or the like is formed on a support substrate having light transparency, made of glass or the like, and further an organic emitting layer and a counter reflective electrode are stacked thereon successively. Light generated in the organic emitting layer passes through the transparent support substrate to exit the device. Meanwhile, the top emission type has a structure wherein a reflective electrode is formed on a support substrate, and further an organic emitting layer and a counter transparent electrode are successively stacked thereon. Light generated in the organic emitting layer exits not from the side of the support substrate but from the side of the counter transparent electrode. For the top emission type, the following technique has been investigated: a technique of rendering its counter transparent electrode a light semi-transparent and semi-reflective electrode to make a micro-cavity structure, and further selecting the distance between the counter electrode and the reflective electrode to amplify the intensity of light generated from its organic emitting layer, thereby emitting a light having a high intensity. See Patent Document WO 01/39554.

White emission is indispensable for illumination. As a white emission organic EL device, there has been investigated a technique of forming the above-mentioned organic emitting layer by stacking plural emitting layers which exhibit different emission colors. For example, Japanese Laid-Open Patent Application 2002-272857 discloses a technique of providing an organic layer of two blue emitting layers and an orange emitting layer, as shown as "hole-transporting layer/blue emitting layer/orange emitting layer/electron-transporting layer". Japanese Laid-Open Patent Application 2004-006165 discloses a technique of stacking emitting layers in the three primary colors of red-green-blue (RGB), as shown as "hole-injecting layer/hole-transporting layer/red emitting layer/blue emitting layer/green emitting layer/electron-injecting layer".

In attempting to use an organic EL device as described above to fabricate a flat illuminating light source, the simplest structure is a structure wherein an organic emitting layer is sandwiched between upper and under, or lower, electrodes in such a manner that the whole of the organic emitting layer is covered. However, this structure has the following problems: (i) a drop in voltage is caused in the electrode sections, in particular, the transparent electrode section, whereby the current density in the whole emission section does not become uniform so that the luminance becomes nonuniform in the emission surface of the device; (ii) electric current flowing in the emission section concentrates on an interconnection section where the emission section is connected to a driving power source, so that Joule heat is generated; and (iii) when an electrical short is generated between the upper and under electrodes at some spot in the emission surface, applied current concentrates on this conductive spot so that the periphery of the conductive spot no longer emits light.

Problems (i) and (iii) can be solved by making matrix electrodes wherein electrode lines cross at right angles, and arranging auxiliary lines having low resistance along the matrix electrodes. However, problem (ii) is not solved.

When the current density generated when voltage V is applied to an organic EL device is represented by J, J and V have, for example, a nonlinear relationship of $J = A \cdot V^n$ wherein A is a proportional constant, and $n > 1$. When the voltage V is raised, the current density J abruptly becomes large. When the area of the emission section is represented by S, the current flowing in the entire emission section becomes SJ. This current concentrates on the interconnection section connecting the emission section with the driving power source. Consequently, Joule heat is generated and the interconnection section deteriorates thermally.

One means for decreasing the Joule heat generated in the interconnection section is to lower the resistance of the interconnection section. However, the interconnection section inside an illuminating light source is spatially restricted. Thus, it is difficult to lower the resistance. For this reason, it has been desired to lower the current density J which flows in the organic EL emission section to apply an organic EL device to large-area illumination.

Techniques for lowering the current density J, have been disclosed. Japanese Laid-Open Patent Application 11-329748 discloses a technique of stacking organic emitting layers in the direction of electric conduction to provide an intermediate conductive layer therebetween. Stack type elements wherein organic emitting layers are stacked in the direction of electric conduction are disclosed in Japanese Laid-Open Patent Application 11-329748 and 2003-045676, among others.

The stack type elements, wherein organic emitting layers are stacked in the direction of electric conduction, each have a structure wherein a number of organic EL emitting layers are stacked to interpose connecting layers therebetween. The driving voltage therefor increases by N times, but the current value decreases by 1/N times. Consequently, Joule heat in an interconnection section can be lowered by 1/N. As the connecting layer for supplying carriers to the adjacent organic emitting layers, use of any of a thin film, an inorganic material, and an organic material which generates carriers are disclosed. However, in all methods it is difficult to realize carrier balance for emitting light evenly in N organic emitting layers. To obtain white emission important for illumination, it is necessary to stack organic emitting layers which exhibit different emission colors. In this case, it is further difficult to adjust carrier balance since the organic materials used in the emitting layers are different. The distance between the electrodes becomes large since the N layers are stacked, which causes the following problems: it is difficult to attain optimization of optical interference; the efficient high quantity light emission cannot be easily achieved; and the luminous efficiency cannot easily be increased.

Japanese Laid-Open Patent Application 11-329748 discloses a technique of arranging organic EL devices in series on an emission surface. A similar technique is disclosed in Japanese Laid-Open Patent Application 2004-342614. Wherein there are three lines whereby four organic EL devices are connected to each other in series, and those three lines exhibit emission colors different from each other. See FIG. 14. A structure wherein the three lines emit light rays of the three primary colors, blue, green and red, respectively, enables white light emission relatively easily, unlike the above-mentioned stack type. However, there remain problems that the uniformity of the white is insufficient, the efficiency for emitting white light is insufficient, and the driving voltage becomes too high.

An object of the invention is to provide an organic EL apparatus which at low total driving voltage emits excellent whiteness uniformity.

BRIEF SUMMARY OF THE INVENTION

The inventors have repeatedly investigated, and then found that the aforementioned problems can be solved by producing two or more different emission colors from devices connected in series. Furthermore, the inventors found that two reflection faces provided in each emitting device, and setting the distance between the reflection faces to narrow the natural emission width of light emitted from an emission center in an organic emitting layer, can produce high efficiency. Further, if the shape of the emitting devices is optimized and the arrangement of different colors therefrom is devised, an organic EL apparatus which at low total driving voltage produces excellent whiteness uniformity.

As a first aspect of the invention, disclosed is an organic EL apparatus comprising: a first emitting device wherein a first organic emitting layer is between a first under, or lower, electrode and a first upper electrode; and a second emitting device wherein a second organic emitting layer is between a second under, or lower, electrode and a second upper electrode, the second under electrode being electrically connected to the first upper electrode or being made of the same material as the material of the first upper electrode; the first and second emitting devices being placed on a common surface; and the two emitting devices emitting different emission colors.

As a second aspect of the invention, disclosed is an organic EL apparatus comprising: a first emitting device wherein a first organic emitting layer is between a first under, or lower, electrode and a first upper electrode; a second emitting device wherein a second organic emitting layer is between a second under, or lower, electrode and a second upper electrode, the second under, or lower, electrode being electrically connected to the first upper electrode or being made of the same material as the material of the first upper electrode; and a third emitting device wherein a third organic emitting layer is between a third under, or lower, electrode and a third upper electrode, the third under, or lower, electrode being electrically connected to the second upper electrode or being made of the same material as the material of the second upper electrode; the first, second and third emitting devices being placed on a common surface; and the three emitting devices exhibiting two or more different emission colors.

As a third aspect of the invention, disclosed is an organic EL apparatus, comprising a number N of emitting devices, N being an integer of two or more, wherein the first emitting device comprises a first organic emitting layer between the first under, or lower, electrode and the first upper electrode, the $(k+1)^{th}$ emitting device, k being an integer of 1 or more and N−1 or less, comprises the $(k+1)^{th}$ organic emitting layer between the $(k+1)^{th}$ under electrode and the $(k+1)^{th}$ upper electrode, the $(k+1)^{th}$ under electrode being electrically connected to the $k^{th}$ upper electrode or being made of the same material as the material of the $k^{th}$ upper electrode, and the $N^{th}$ emitting device comprises the $N^{th}$ organic emitting layer between the $N^{th}$ under electrode and the $N^{th}$ upper electrode, the $N^{th}$ under electrode being electrically connected to the $(N-1)^{th}$ upper electrode or being made of the same material as the material of the $(N-1)^{th}$ upper electrode, the N emitting devices are placed on a common surface, and the N emitting devices exhibit two or more different emission colors.

As a fourth aspect of the invention, disclosed is an organic EL apparatus, wherein at least one emitting device has two reflection surfaces, at least one of the reflection surfaces is semi-reflective and semi-transparent, the organic emitting layer is positioned between the two optical reflection interfaces, and the distance between the two optical reflection interfaces is determined to narrow the natural emission bandwidth of light emitted from the emission center of the organic emitting layer.

As a fifth aspect of the invention, disclosed is an organic EL apparatus, wherein emission surfaces of the emitting devices have a rectangular shape at a length ratio of long sides to short sides of 10 or more, two adjacent emitting devices are electrically connected to each other in the longitudinal direction of their rectangular shape, and the emitting devices are arranged in a diagonal pattern.

As a sixth aspect of the invention, disclosed is an organic EL apparatus which comprises a light diffusive member on the light emission side.

According to the invention, it is possible to provide an organic EL apparatus which at low total driving voltage emits excellent whiteness uniformity.

DETAILED DESCRIPTION

1. First Embodiment

Figure 1:
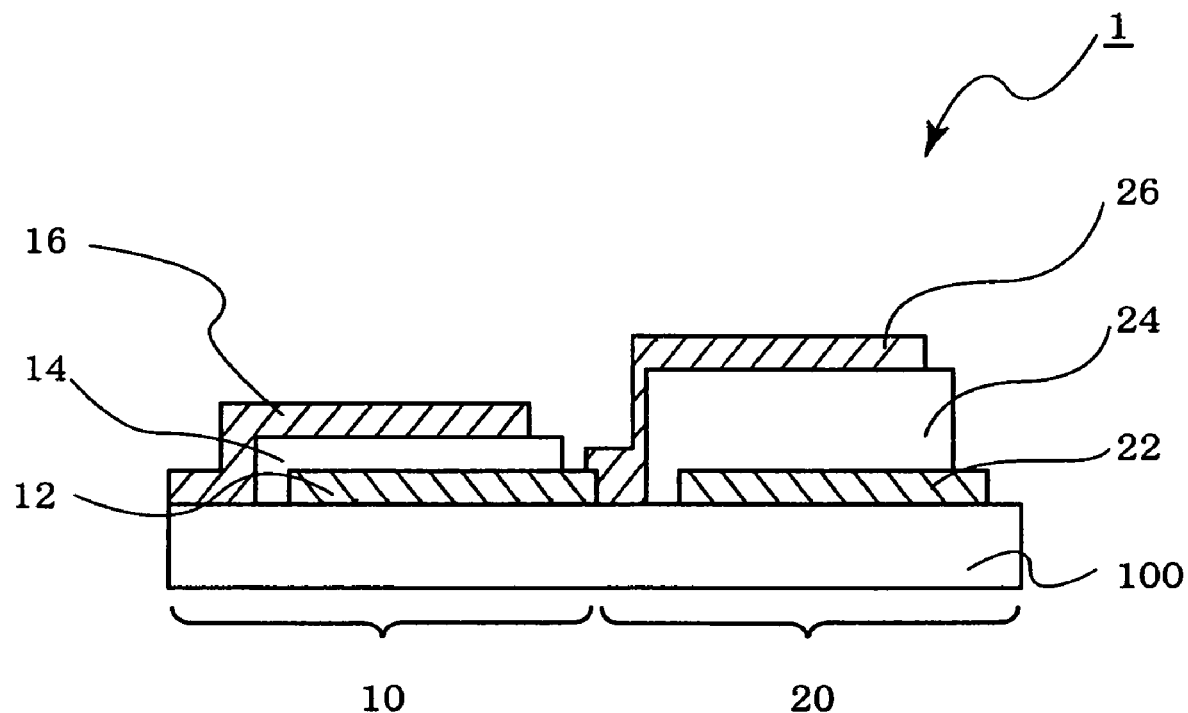
FIG. 1 schematically illustrates an organic EL apparatus of a first embodiment of the invention.

FIG. 1 schematically illustrates a first embodiment of the invention.

As illustrated in this view, an organic EL apparatus 1 has a first emitting device 10 and a second emitting device 20 arranged in parallel on a substrate 100.

The first emitting device 10 has a structure wherein a first under, or lower, electrode 12, a first organic emitting layer 14, and a first upper electrode 16 are stacked, in this order, on the substrate 100.

The second emitting device 20 has a structure wherein a second under, or lower, electrode 22, a second organic emitting layer 24, and a second upper electrode 26 are stacked, in this order, on the substrate 100.

The first and second under, or lower, electrodes 12 and 22 each functions as an anode for injecting holes into the organic emitting layer or a cathode for injecting electrons into the organic emitting layer. When the first under, or lower, electrode 12 is the cathode, the second upper electrode 26 is the cathode. When the first under electrode 12 is the anode, the second upper electrode 26 is the anode. In the embodiment, the first under electrode 12 and the second upper electrode 26 are electrically connected to each other. Since the under electrodes and the upper electrodes are different in polarity, the first emitting device 10 and the second emitting device 20 are connected to each other in series. The first under electrode 12 and the second upper electrode 26 may be made of the same material or different materials with a connecting section therebetween.

The first organic emitting layer 14 and the second organic emitting layer 24 exhibit different emission colors. When the apparatus is used for white illumination, it is preferred to select, for example, the combination of blue with yellow, or bluish green with reddish orange.

Figure 2:
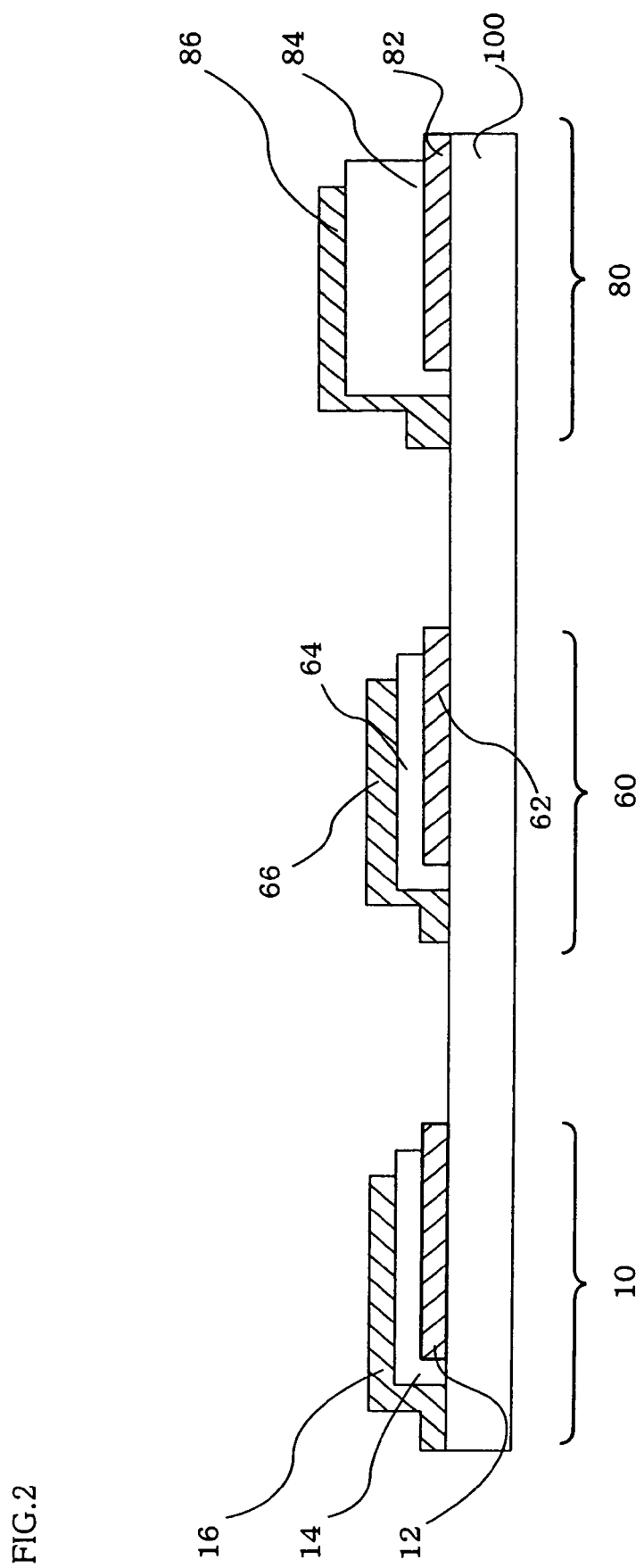
FIG. 2 schematically illustrates an organic EL apparatus wherein N emitting devices are arranged in parallel in the first embodiment.

The organic EL apparatus of the present embodiment can include N first emitting devices 10 and N second emitting devices 20 wherein N is an integer of 2 or more. In this case, it is preferred that N devices are arranged such that the under electrode of a device is connected to the upper electrode of the next device as illustrated in FIG. 2.

As illustrated in this view, a first emitting device 10, a $(k+1)^{th}$ emitting device 60, and an $N^{th}$ emitting device 80 are arranged in parallel on a substrate 100. k is an integer of 1 or more and N−1 or less.

The first emitting device 10 is as described above.

The $(k+1)^{th}$ emitting device 60 has a structure wherein a $(k+1)^{th}$ under electrode 62, a $(k+1)^{th}$ organic emitting layer 64, and a $(k+1)^{th}$ upper electrode 66 are stacked, in this order, on substrate 100. In this embodiment, a $k^{th}$ under electrode (not illustrated) is electrically connected to the $(k+1)^{th}$ upper electrode 66. The $k^{th}$ under electrode and the $(k+1)^{th}$ upper electrode 66 may be made of the same material or different materials with a connecting section therebetween.

The $N^{th}$ emitting device 80 has a structure wherein an $N^{th}$ under electrode 82, an $N^{th}$ organic emitting layer 84, and an $N^{th}$ upper electrode 86 are stacked, in this order, on substrate 100. In the embodiment, an $(N−1)^{th}$ under electrode (not illustrated) is electrically connected to the $N^{th}$ upper electrode 86. The $(N−1)^{th}$ under electrode and the $N^{th}$ upper electrode 86 may be made of the same material or different materials with a connecting section therebetween.

There are various methods for arranging the first emitting devices 10 and the second emitting devices 20. For example, FIGS. 3(A) and (B) are top views of an organic EL apparatus according to the first embodiment. In these views, an arrangement of devices in four columns and four rows is illustrated. The first emitting devices are represented by A1 to A4, and the second emitting devices are represented by B1 to B4. The symbols A and B indicate that emission colors therefrom are different from each other.

Figure 3:
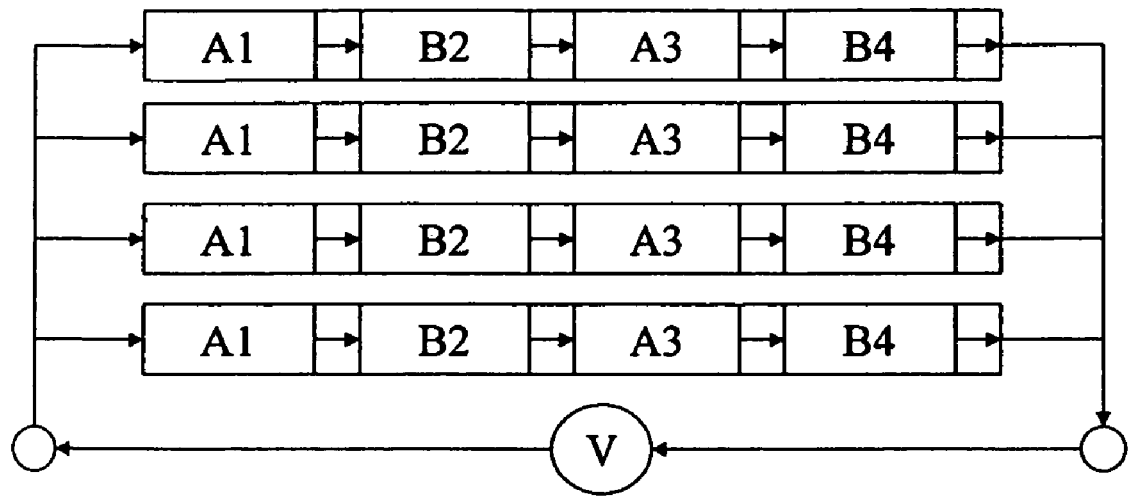
FIG. 3(A) is a first top view of the organic EL apparatus in FIG. 1.
FIG. 3(B) is a second top view of the organic EL apparatus in FIG. 1.
Figure 3:
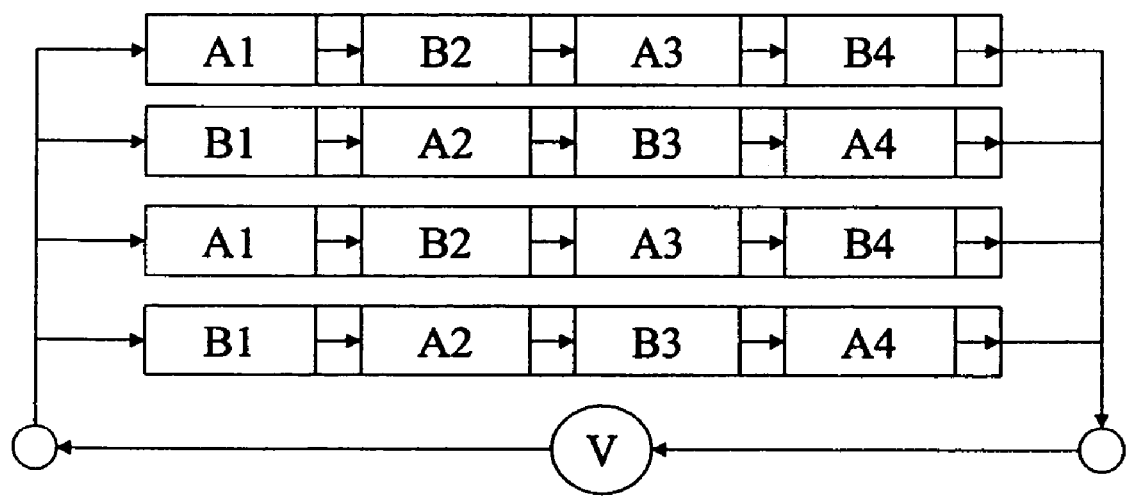

In FIG. 3(A), a unit of four emitting devices A1, B2, A3 and B4 connected to each other in series constitutes one row, and four rows are connected in parallel to a driving power source V. Viewing the columns in FIG. 3(A), emission colors A and B are each vertically arranged in one column. In FIG. 3(B), emission colors A and B are alternately arranged in both the columns and the rows. The arrangement illustrated in FIG. 3(B) is called a "diagonal arrangement", and the color mixture level of the emission colors A and B is high. When the colors A and B are combined with each other to exhibit white color, the uniformity and the visibility of the white are excellent. Thus, the arrangement is preferable.

Figure 4:
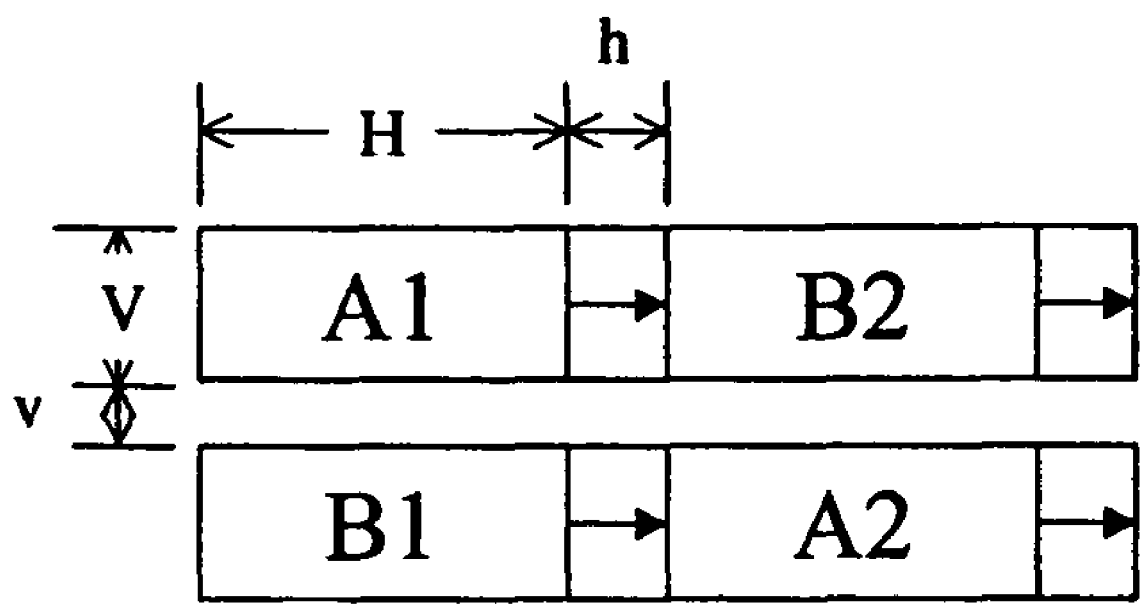
FIG. 4 is an enlarged view of a portion of a diagonal arrangement in FIG. 3(B).

FIG. 4 is an enlarged view of a portion of the diagonal arrangement in FIG. 3(B). In this embodiment, each of the emitting devices A1, B2, B1 and A2 is rectangular, and the devices are preferably connected to each other in series along the longer dimensions of the rectangles. When the length of longer sides of the emitting devices is represented by H and that of shorter sides thereof is represented by V, the ratio of H/V is preferably 3.5 or more. This makes it possible to make the number of the emitting devices connected in series small, so that the driving voltage can be in a practical range. The ratio is more preferably 5 or more.

This point will be more specifically described below. For illuminations or displays, it is necessary to consider the color mixture distance thereof in conjunction with the screen size or desired use thereof. The color mixture distance is an index indicating how much distance from a screen is required so that colors can be viewed as uniformly mixed when emission pixels (emitting devices) in different colors are arranged side by side. For example, for 12-mm pitch pixels, the color mixture distance is about 5 m. It is assumed that a square emission surface having diagonals of, e.g., 5-in. length is formed. For this emission surface, to restrain the color mixture distance to about 30 cm, it is necessary to set the pitch of emitting devices exhibiting different colors to (12 mm/5 m×30 cm)=0.72 mm or less. Thus, when the emitting devices are 0.72-mm squares, it is necessary to arrange the emitting devices in numbers of 90 mm/0.72 mm=125 on each side (90 mm) corresponding to the 5-in. diagonals.

In this embodiment, organic EL devices are used as the emitting devices. To generate output of practical brightness (for example, a luminance of 1000 cd/m² or more) from organic EL devices, a voltage of at least 3 V or higher is required. Accordingly, when 125 emitting devices are connected in series, a voltage of 300 V or more, such as (125×3 V)=375 V, becomes necessary. But, this is not practical. Conversely, to attempt to limit voltage to 100 V or less, which is typical for household articles, the number of the devices connected to in series is 100 V/3 V=33 or less. In this case, it is necessary to set the length of the devices in the series connection direction to 90 mm/33=2.7 mm or more. To set the color mixture distance to 30 cm or less, it is necessary to set the length of the shorter sides of the emitting devices to 0.72 mm or less. It becomes preferable to set the ratio of the length of the longer sides to that of the shorter sides of the emitting devices to approximately 3.5 or more. This example, has emission surface diagonals of about 5 inches. However, considering that the color mixture distance can be a larger value in proportion to the area of an emission surface, it is preferred for an emission surface of any size to have a ratio of the length of longer side to that of shorter side of 3.5 or more.

Furthermore, in this embodiment, the first emitting devices 10 and the second emitting devices 20 emit light of different colors. To cause the devices to emit light of different colors, the following methods can be used: (i) making emitting materials used in the organic emitting layers different; and (ii) forming such organic emitting layers to contain two or more emitting components and emitting different colors by using a color-adjusting effect caused by a color filter or a fluorescence converting layer. Of these, method (i), that is, the use of different emitting materials in the two emitting devices, is preferred in this embodiment.

In the present embodiment, the following is particularly preferred: two reflection surfaces are formed inside an emitting device, at least one of the reflection surfaces is semi-reflective and semi-transparent, an organic emitting layer is positioned between the two optical reflection interfaces, and the distance between the two optical reflection interfaces is determined to narrow the natural emission bandwidth of light emitted from an emission center in the organic emitting layer. It is sufficient that the number of the reflection surfaces is at least two. The number may be three or more.

The following more specifically describes a method for determining the distance between the two optical reflection interfaces to narrow the natural emission bandwidth of the light emitted from the emission center in the organic emitting layer to a case where $Alq_3$ is used as an emitting medium layer.

The structure of such a device is obtained by stacking, on a glass substrate, an Al/ITO stacked layer as an anode; 4,4'-bis(N-(1-naphthyl)-N-phenyl amino)biphenyl (NPD) as an hole-transporting layer; tris(8-quinolinol)aluminum ($Alq_3$) as an emitting medium layer; Alq:Li as an electron-transporting layer; and Mg:Ag/ITO as a cathode. In sequence this is recited: glass (0.7 mm)/Al (200 nm)/ITO (10 nm)/NPD (X nm)/$Alq_3$ (30 nm)/Alq:Li (10 nm)/Mg:Ag (10 nm)/ITO (100 nm), wherein the interfaces between Al and ITO, and between Alq:Li and Mg:Ag, form two reflection surfaces.

First, the organic emitting layer is NPD (X nm)/$Alq_3$ (30 nm)/Alq:Li (10 nm) in this example. When electric current is applied to this organic EL device, both NPD and $Alq_3$ in the organic emitting layer may emit light. However, the emission intensity of $Alq_3$ is by far larger. The emission center in the organic emitting layer means a material exhibiting the largest emission intensity in the organic emitting layer. The natural emission light bandwidth means a full bandwidth at half maximum (FWHM) in the photoluminescence spectrum of a thin film made only of an emitting material which forms the emission center, or a thin solution thereof. The wording "narrowing the natural emission bandwidth" means that the FWHM of the emission from the organic EL device is made more narrow than the natural emission bandwidth.

Figure 5:
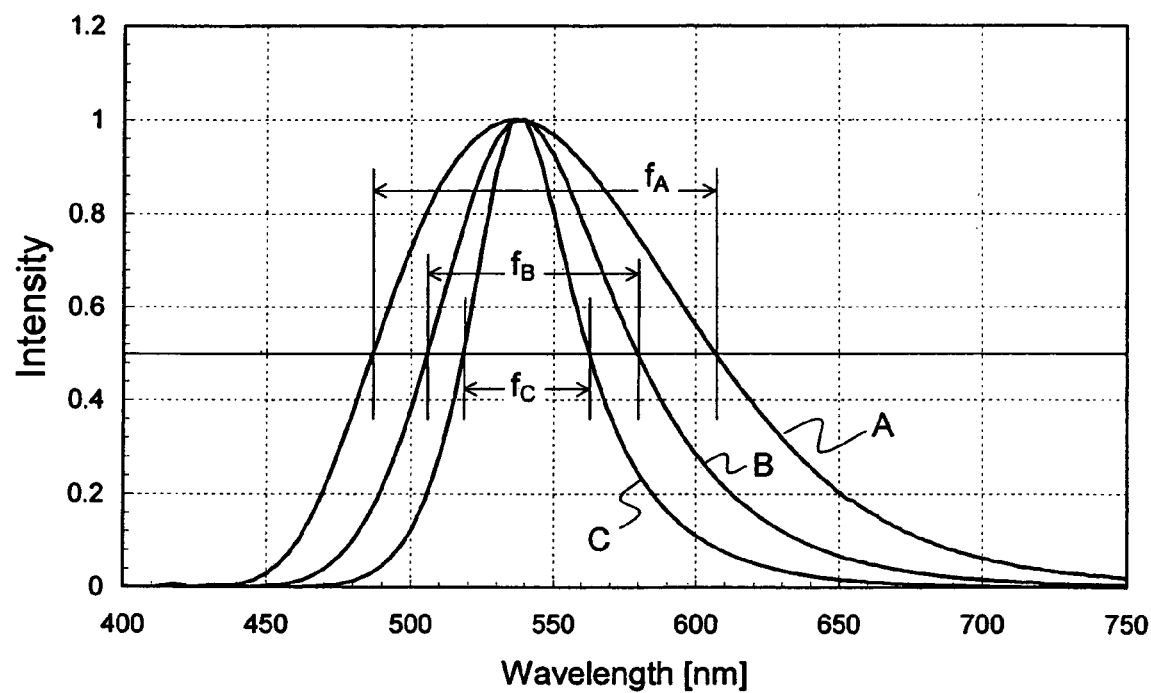
FIG. 5 is a chart illustrating full bandwidths at half maximum in organic EL apparatuses having two or more light reflection faces.

For this purpose, the distance between the reflection surfaces should be selected. For example, the following cases are considered: a case where the thickness X of NPD is 60 nm in the above-mentioned specific example, and a case where the thickness X is 205 nm therein. The distance between the two reflection surfaces is 110 nm and 255 nm, respectively. FIG. 5 shows a relationship between the natural emission bandwidth of Alq, which is an emission center, and the FWHM of emission from each of the organic EL devices wherein X is 60 nm and 205 nm, respectively.

In FIG. 5, A represents the photoluminescence spectrum of the thin film of the emission center, $Alq_3$; B represents the EL spectrum when the thickness X of NPD is 60 nm; and C represents the EL spectrum when the thickness X of NPD is 205 nm. Each of the spectra is a spectrum obtained through normalization by use of the maximum peak intensity. Therein, the FWHMs $f_A$, $f_B$ and $f_C$ of the spectra A, B and C are 120 nm, 74 nm, and 45 nm, respectively.

Figure 6:
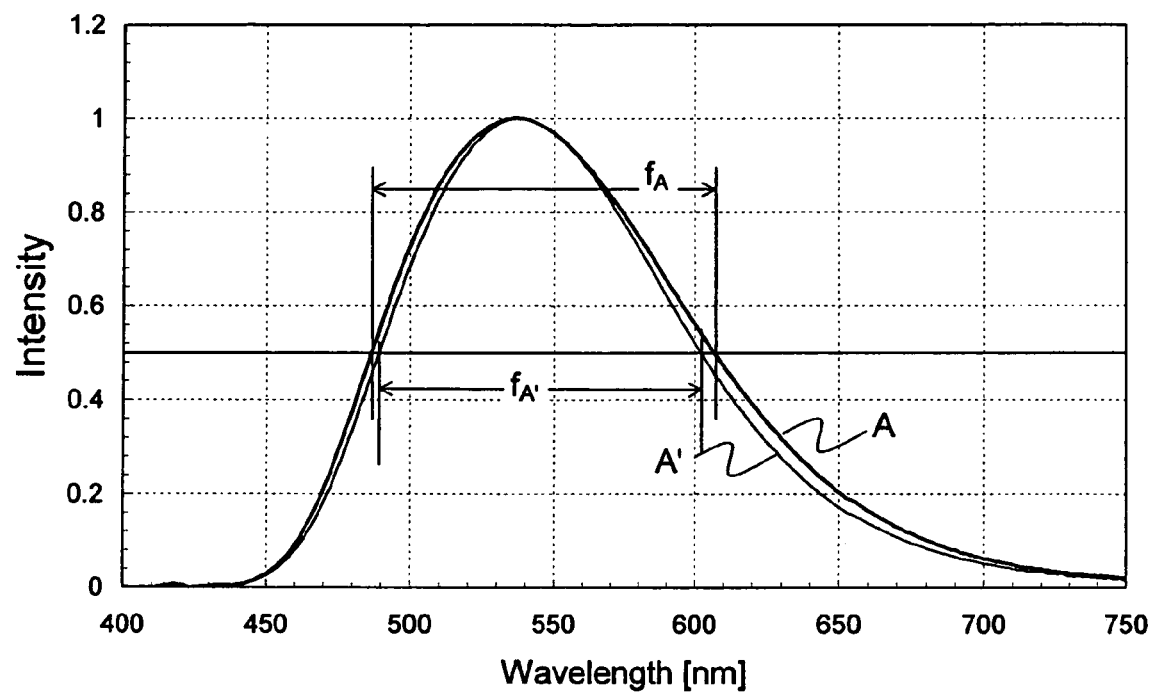
FIG. 6 is a chart illustrating full bandwidths at half maximum in organic EL apparatuses having a single light reflection face.

The following is also considered: the relationship between the natural emission bandwidth of a device structure having only one reflection surface and the bandwidth of the EL spectrum thereof. As the structure of the device is obtained by stacking, on a glass substrate, ITO as an anode, NPD as an hole-transporting layer, $Alq_3$ as an emitting medium layer, Alq:Li as an electron-transporting layer, and Al as a cathode. In sequence this is recited: glass (0.7 mm)/ITO (130 nm)/NPD (60 nm)/$Alq_3$ (40 nm)/$Alq_3$:Li (20 nm)/Al (200 nm), wherein only the interface between Al and $Alq_3$:Li forms a reflection surface. FIG. 6 is a graph wherein the photoluminescence spectrum (A) of the thin film of $Alq_3$, which is an emission center, is compared with the EL spectrum (A') of the organic EL device. The FWHM $f_{A'}$ of the EL spectrum A' is 112 nm. As understood from FIG. 6, where a device has only one reflection surface, even if the thickness of each of the layers is adjusted in any way, the FWHM of the EL spectrum is almost the same as the natural emission bandwidth.

Figure 7:
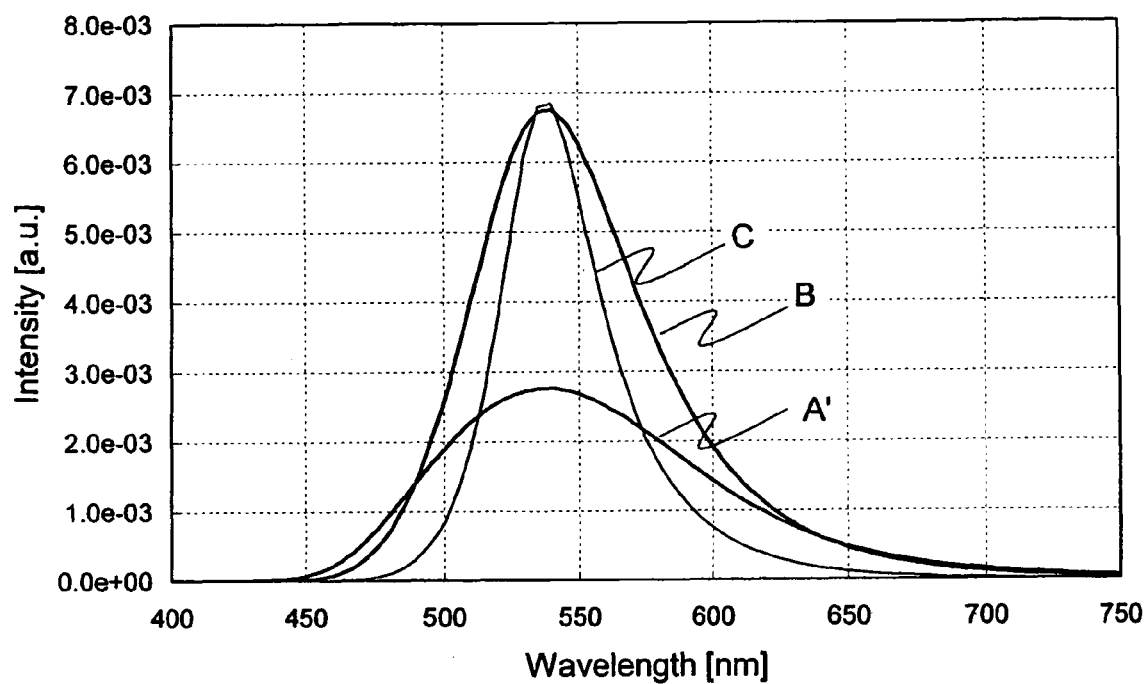
FIG. 7 is a graph wherein intensities of spectra A', B, and C are compared when the same current density is applied.

FIG. 7 is a graph wherein the intensities of the spectra A', B and C are compared when the same current density is applied.

As understood from FIG. 7, the FWHM of the EL spectrum is made more narrow than the natural emission bandwidth, thereby making the maximum peak intensity larger than that obtained with the device having only one reflection surface. Thus the emission color which the emission center originally exhibits can be made intense.

In this embodiment, the first emitting device 10, the second emitting device 20, or both, may have two reflection surfaces, and the emission bandwidth of each of the emissions therefrom is made narrow.

2. Second Embodiment

Figure 8:
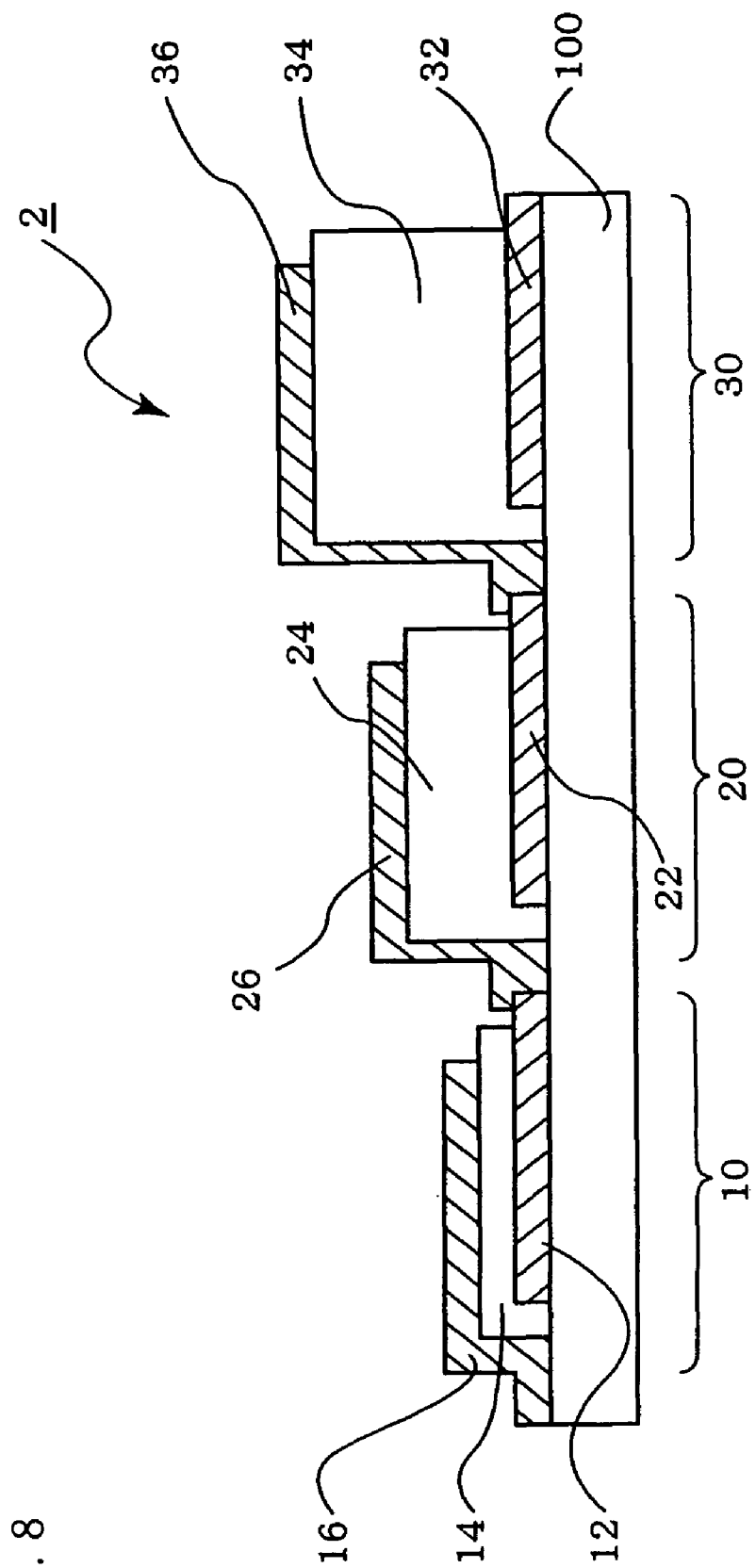
FIG. 8 schematically illustrates an organic EL apparatus of a second embodiment according to the invention.

FIG. 8 is a schematic view illustrating a second embodiment of the invention.

As illustrated in this view, an organic EL apparatus 2 is different from the first embodiment only in that the apparatus has a third emitting device 30. In other words, the organic EL emitting device 2 has a first emitting device 10, a second emitting device 20 and a third emitting device 30 arranged on a substrate 100. The first emitting device 10 and the second emitting device 20 are the same as in the above-mentioned first embodiment. Thus, description thereof is not repeated here.

The third emitting device 30 has a structure wherein a third under electrode 32, a third organic emitting layer 34 and a third upper electrode 36 are stacked, in this order, on substrate 100. The second under electrode 22 and the third upper electrode 36 are electrically connected to each other. The second under electrode 22 and the third upper electrode 36 may be made of the same material or different materials with a connecting section therebetween.

The first, second, third devices exhibit two or more colors. Preferably, the three emitting devices exhibit different colors, for example, the three primary colors, blue, green, and red, respectively. In this way, it becomes possible to realize a light source for white light emission including the three primary colors, blue, green, and red, in good balance.

The organic EL apparatus of this embodiment may also contain N first emitting devices 10, N second emitting devices 20 and N third emitting devices 30, wherein N is an integer of 2 or more. At this time, it is preferred that N such devices are arranged so that the under electrode of a device is connected to the upper electrode of the next device, as illustrated in FIG. 2.

Figure 9:
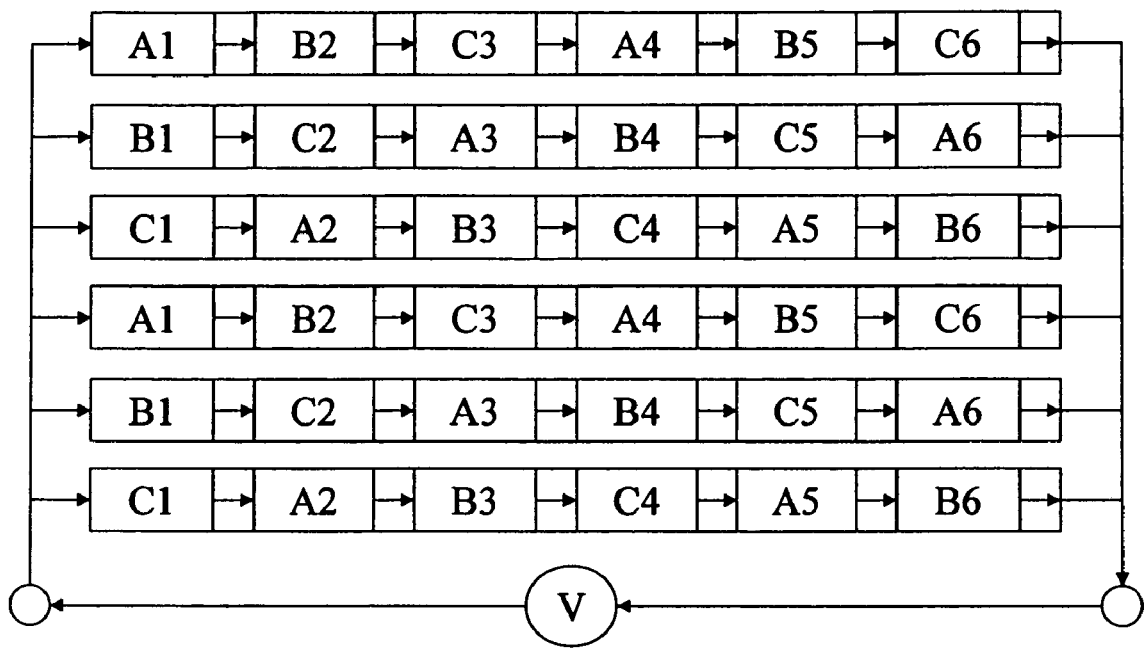
FIG. 9 is a top view of the organic EL apparatus in FIG. 8.

There are various methods for arranging the first emitting devices 10, the second emitting devices 20, and the third emitting devices 30. For example, FIG. 9 is a top view of an organic EL apparatus according to the second embodiment. In this view, an arrangement of devices in six columns and six rows is illustrated. The first emitting devices are represented by A1 to A6, the second emitting devices are represented by B1 to B6, and the third emitting devices are represented by C1 to C6. The symbols A, B and C indicate that emission colors therefrom are different from each other.

As illustrated in FIG. 9, the emitting devices A, B and C of three kinds are connected to each other in series in the direction of electrical conduction. A so-called diagonal arrangement is preferred, wherein pixels exhibiting colors different from each other, such as A, B and C, are also arranged in the direction perpendicular to the electrical conduction direction.

Figure 10:
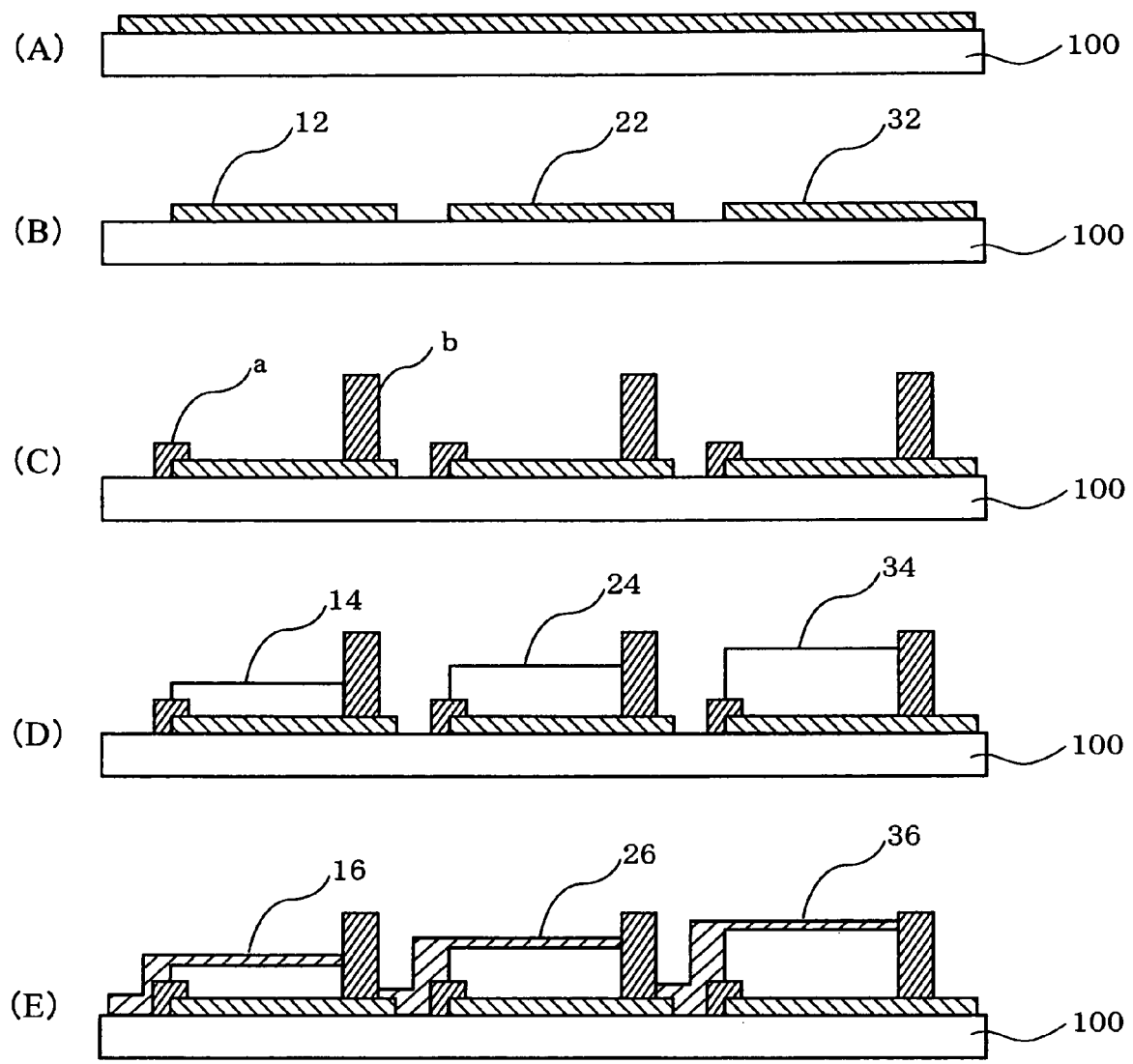
FIGS. 10(A) to (E) schematically illustrate a process for fabricating the organic EL apparatus in FIG. 8.
Figure 11:
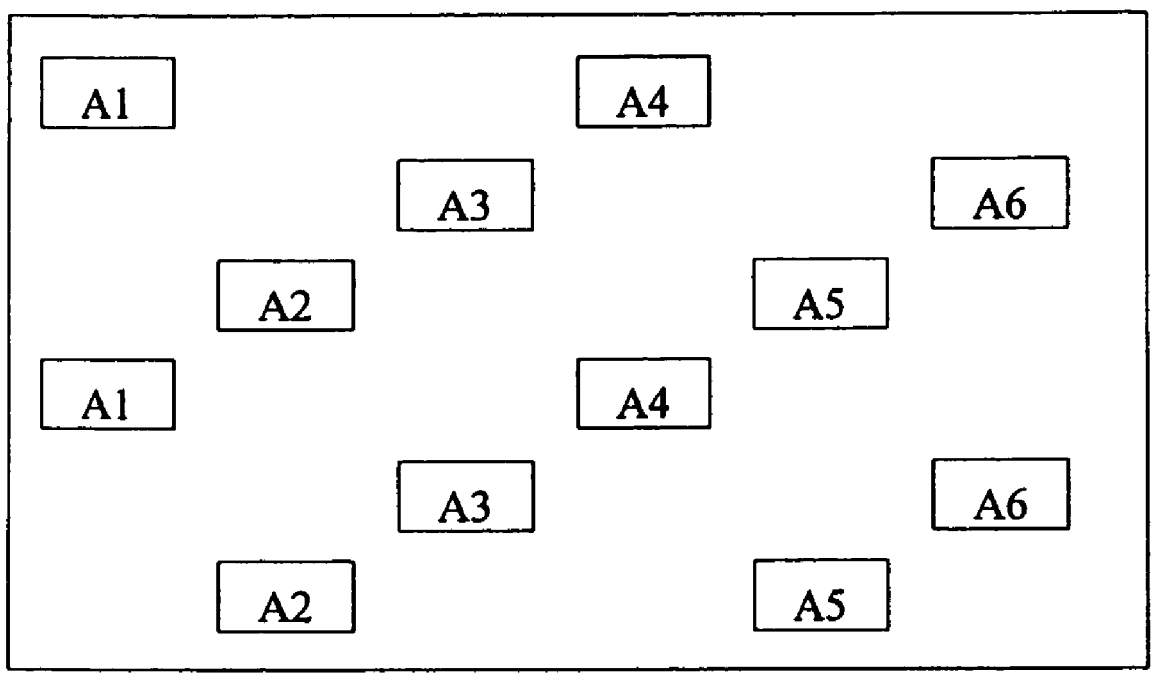
FIG. 11 illustrates a mask wherein openings are made in a diagonal form.

Such an organic EL apparatus can be fabricated, for example, as follows. FIG. 10 schematically illustrates a process for fabricating an organic EL apparatus of the second embodiment. First, a common under electrode is formed on a supporting substrate 100 (FIG. 10(A)). Next, patterning is performed by a method suitable for the material of the under electrode, to form under electrode patterns 12, 22 and 32 corresponding to $1^{st}$, $2^{nd}$ and $3^{rd}$ emitting devices 10, 20 and 30, respectively (FIG. 10(B)). Next, insulating layers a and b are formed to insulate the under electrodes from upper electrodes (FIG. 10(C)). The insulating layers a and b can be formed, for example, by forming a photoresist film on the entire surface, light-exposing, developing, and peeling to form only the insulating layer a, next forming a photoresist film thereon again, and then performing the same steps to form the insulating layer b. Next, organic emitting layers 14, 24 and 34 are independently formed from certain materials in certain thicknesses, the materials and thickness being designed for the $1^{st}$, $2^{nd}$, and $3^{rd}$ emitting devices 10, 20 and 30, respectively (FIG. 10(D)). To render the planar arrangement of the $1^{st}$, $2^{nd}$, and $3^{rd}$ emitting devices 10, 20 and 30, a diagonal arrangement as illustrated in FIG. 9, for example, a mask wherein openings are made in a diagonal form, as illustrated in FIG. 11 is prepared, and vapor-depositing steps are successively advanced while the mask is shifted one by one through positions of rows or columns. Next, upper electrodes 16, 26 and 36 are formed for the $1^{st}$, $2^{nd}$, and $3^{rd}$ emitting devices, respectively (FIG. 10(E))). The second upper electrode 26 and the third upper electrode 36 are electrically connected to the first under electrode 12 and the second under electrode 22, respectively.

In this embodiment also, any one or all of the first, second, and third emitting devices 10, 20 and 30 have two reflection surfaces, and the emission bandwidth of light emitted from each of the devices is made narrow.

In this embodiment, where the first, second, and third emitting devices 10, 20 and 30 emit light in the three colors has been described. However, when four or more emitting devices are used, light in four or more colors can be emitted.

3. Third Embodiment

Figure 12:
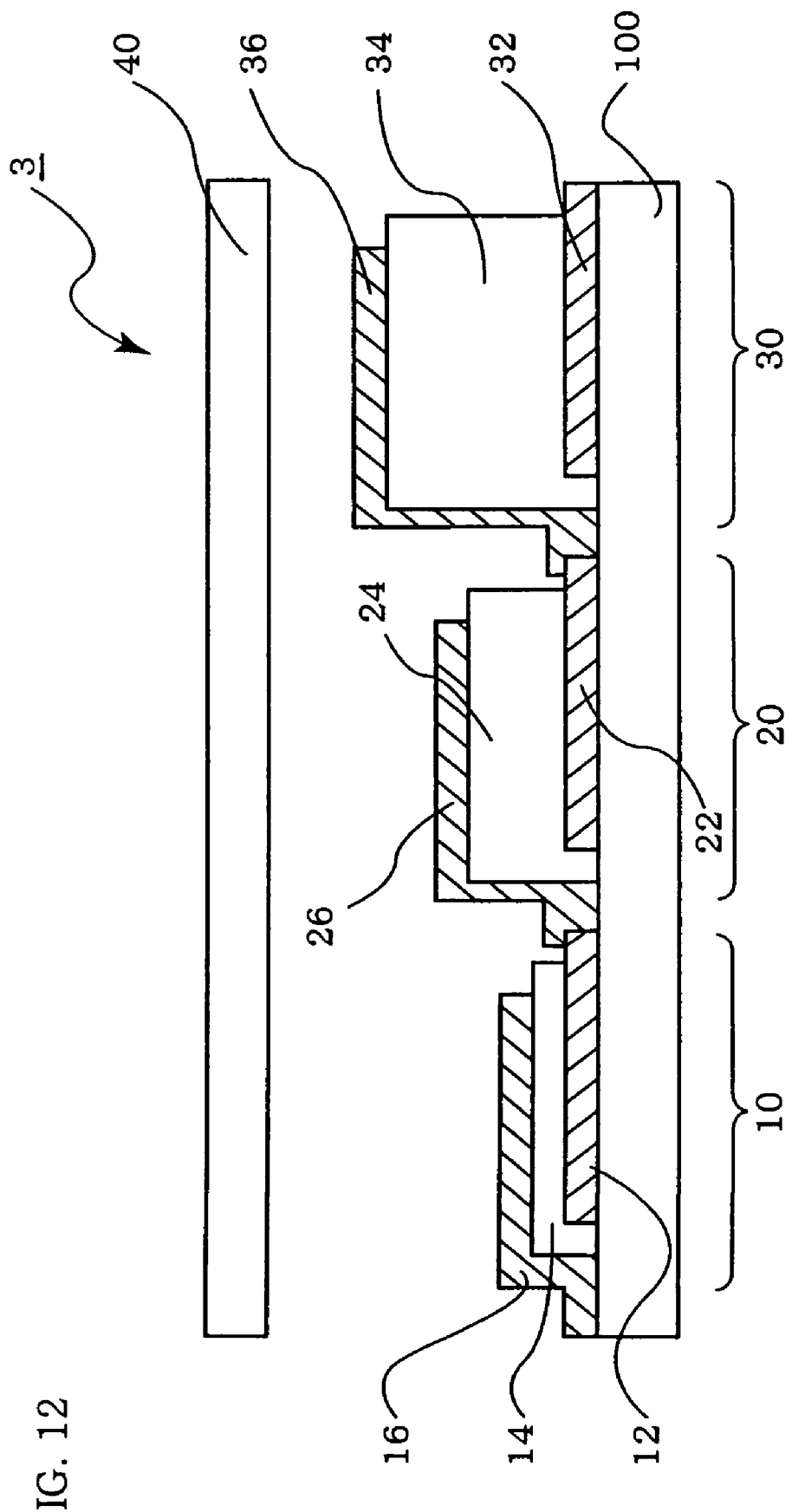
FIG. 12 schematically illustrates an organic EL apparatus of a third embodiment according to the invention.

FIG. 12 illustrates a third embodiment of the invention.

As illustrated in this view, the third embodiment has a structure wherein a light diffusible member 40 is provided in the organic EL apparatus of the second embodiment and is present on the light emission side relative to the upper electrodes of the emitting devices thereof.

Figure 13:
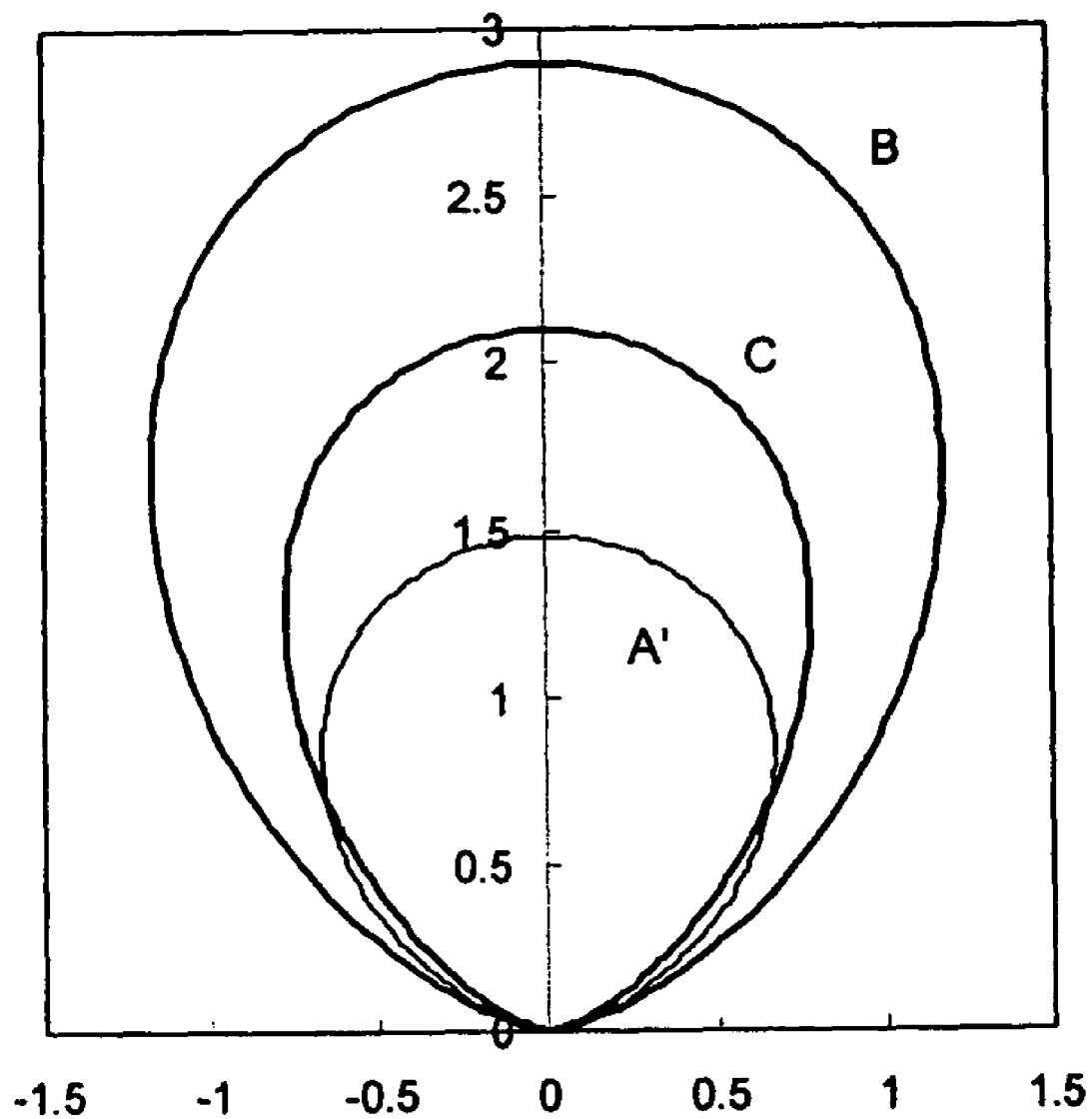
FIG. 13 illustrates a radiation pattern representing the angle dependency of emission intensity.
Figure 14:
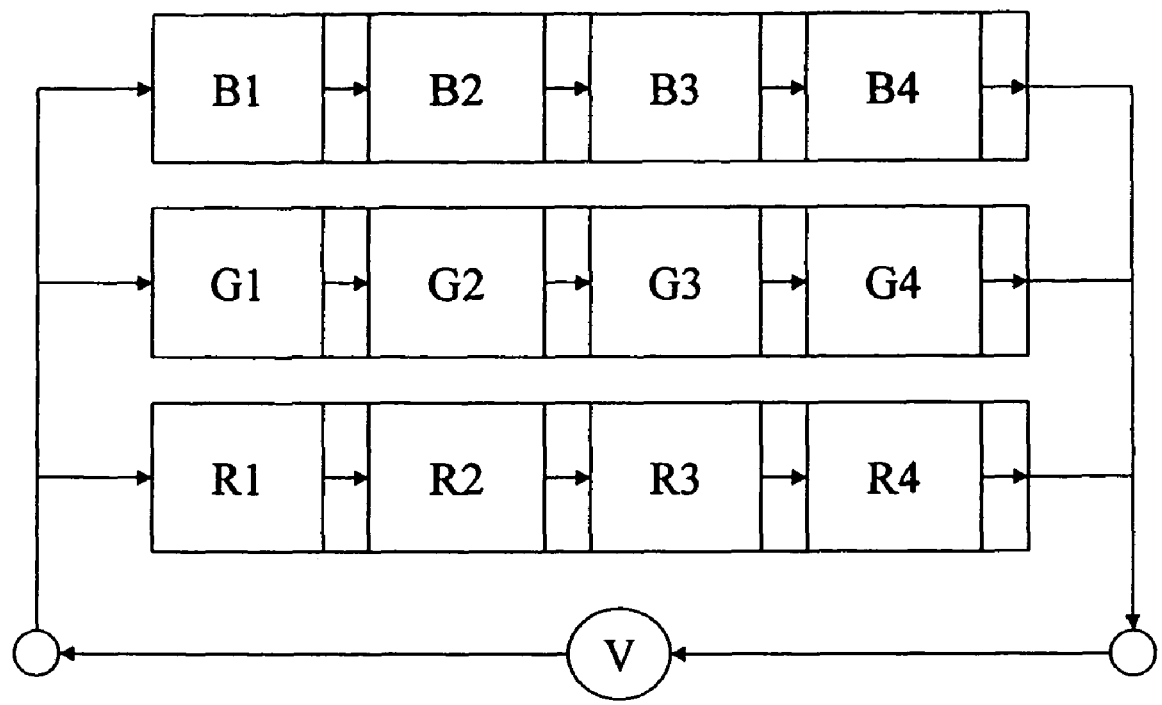
FIG. 14 illustrates a conventional organic EL apparatus wherein organic EL devices are arranged in series in its emission surface.

FIG. 13 is a chart illustrating a radiation pattern representing the angle dependency of the emission intensity of the above-mentioned organic EL apparatus wherein its emission medium layer is made of $Alq_3$. The radiation patterns of the cases where the NPD thickness is 60 nm and 205 nm are represented by B and C, respectively, and the radiation pattern of the case where a single reflective layer is present is represented by A'. As understood from FIG. 13, in the structure wherein the two reflection surfaces are arranged and further the FWHM of the EL spectrum is made more narrow than the natural emission bandwidth of the emission center, the radiation therefrom tends to concentrate forward in the direction of the normal line of the emission surface. Depending on usage, it may be necessary to decrease or relieve the concentration in the forward direction. In this case, the radiation can be relieved into an isotropic radiation pattern, without the loss of any optical intensity, by the function of a light diffusive member formed on the light emission side.

The following describes the members which comprise the emitting apparatus of the invention.

1. Reflection Surfaces

The reflection surfaces are formed by a light reflective layer and a light semi-transparent layer, preferably a light reflective electrode and a light semi-transparent electrode.

(1) Light Reflective Layer and Light Semi-Transparent Layer.

To emit light for use in an organic EL apparatus, at least one member thereof transmits some light (light semi-transparent layer). As such a material, there can be used a metal or an inorganic compound which has transparency and a larger refractive index than that of organic material layers. In the case of a metal, mirror reflection occurs at the surface of the metal. In the case of an inorganic compound which has a larger refractive index than that of organic material layers, light reflection is generated dependent on the refractive index difference therebetween. To make at least one thereof semi-transparent, the thickness thereof is made small or the refractive index difference is adjusted.

(2) Light Reflective Electrode

Where the light reflective electrode is an anode, the electrode needs to supply voltage from a power source for driving an organic EL device to the organic EL device and further injecting holes to the hole-injecting layer. Therefore, it is preferred to use a metal, an alloy or an electrically conductive compound having low resistance and a high work function (for example, 4.0 eV or more), or a mixture or laminate thereof.

Specifically, a single layer of the following or a combination of two or more thereof can be used: indium tin oxide (ITO), indium zinc oxide (IZO), CuI (copper iodide), $SnO_2$ (tin oxide), zinc oxide, gold, silver, platinum, palladium, aluminum, chromium, and nickel.

Where the light reflective electrode functions as a cathode, it is preferred to use a metal, an alloy or an electrically conductive compound having a small work function (for example, less than 4.0 eV), or a mixture thereof for better electron injection.

Specifically, a single layer of the following or a combination of two or more thereof can be used: magnesium, aluminum, indium, lithium, sodium, cesium, and silver.

A super thin film made of the metal(s) and an metal oxide such as aluminum oxide, or a super thin film made of a halide of an alkali metal such as lithium or cesium, may be used.

The optical reflectance of the light reflective electrode to the light emitted from the device is preferably 30% or more, more preferably 50% or more.

(3) Light Semi-Transparent Electrode

As the light semi-transparent electrode, the following can be used, for example: a laminate of a layer made of a material having a high light transparency, such as ITO, among the materials exemplified for the light reflective electrode, and a thin film layer made of a material having a high light reflectivity; or a single thin film layer made of a material having high light reflectivity. When the light reflective electrode is an anode, the light semi-transparent electrode becomes a cathode. When the light reflective electrode is a cathode, the light semi-transparent electrode becomes an anode.

The light reflective layer accepts an electrical charge from one face thereof, and discharges electrical charge from the other face. It is therefore necessary that the layer has electro-conductivity as well as light reflectivity. For this reason, the light reflective layer is preferably a metal film or a semiconductor film. Of these, the metal film is preferred since a high reflectance can be realized within a wide range of visible light from blue to red.

The reflectance of the metal film is determined by the thickness d thereof, the complex refractive index $n - i \cdot \kappa$, and the surface roughness (RMS roughness) $\sigma$. The material of the metal film is preferably a material wherein both the real part n and the imaginary part $\kappa$ of the complex refractive index (equivalent to light absorption coefficient) are small. Specific examples thereof include Au, Ag, Cu, Mg, Al, Ni, Pd, and alloys thereof. When the thickness d is small, the metal film transmits light so that the reflectance thereof becomes small.

The thickness of the light reflective layer, which depends on the value of the imaginary part $\kappa$ of the complex refractive index of a metal used, is preferably 5 nm or more.

When the surface roughness $\sigma$ is large, light causes diffused reflection so that components which are reflected in the direction perpendicular to the emission surface of the organic EL device are reduced. Thus, the surface roughness $\sigma$ is preferably less than 10 nm, more preferably less than 5 nm.

The light transmittance of the light semi-transparent electrode to the light emitted from the device is preferably 30% or more, more preferably 50% or more.

The light reflectance of the light semi-transparent electrode to the light emitted from the device is preferably 20% or more, more preferably 40% or more.

2. Organic Emitting Layers

The organic emitting layers each contains an organic emitting medium layer and, if necessary, each contains a hole-transporting layer, an electron-transporting layer, and so on.

(A) Blue Emitting Layer

The blue emitting layer contains a host material and a blue dopant.

The host material is preferably a styryl derivative, an anthracene derivative, or an aromatic amine. The styryl derivative is preferably at least one selected from distyryl derivatives, tristyryl derivatives, tetrastyryl derivatives, and styrylamine derivatives. The anthracene derivative is preferably an asymmetric anthracene compound. The aromatic amine is preferably a compound having 2 to 4 nitrogen atoms which are aromatically substituted, and is particularly preferably a compound having 2 to 4 nitrogen atoms which are aromatically substituted, and having at least one alkenyl group.

The above-mentioned compounds are specifically described in Japanese Patent Application No. 2004-042694.

The blue dopant is preferably at least one selected from styrylamines, amine-substituted styryl compounds, amine-substituted condensed aromatic rings, and compounds containing a condensed aromatic ring. In this case, the blue dopant may be plural different compounds. The above-mentioned styrylamines and the amine-substituted styryl compounds may be, for example, compounds represented by the following formula (1) or (2), and the above-mentioned compounds containing a condensed aromatic ring may be, for example, compounds represented by the following formula (3).

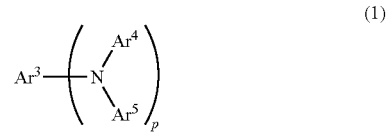

wherein $Ar^3$, $Ar^4$ and $Ar^5$ each independently represents a substituted or unsubstituted aromatic ring having 6 to 40 carbon atoms provided that at least one thereof contains a styryl group, and p represents an integer of 1 to 3.

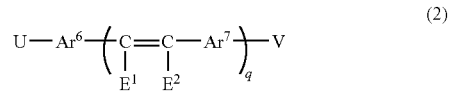

wherein $Ar^6$ and $Ar^7$ each independently represents an arylene group having 6 to 30 carbon atoms, $E^1$ and $E^2$ each independently represents an aryl group having 6 to 30 carbon atoms, an alkyl group, a hydrogen atom, or a cyano group, q represents an integer of 1 to 3, and U and/or V is/are a substituent or substituents which have an amino group, and the amino group is preferably an arylamino group.

wherein A is an alkyl or alkoxy group having 1 to 16 carbon atoms, a substituted or unsubstituted aryl group having 6 to 30 carbon atoms, a substituted or unsubstituted alkylamino group having 6 to 30 carbon atoms, or a substituted or unsubstituted arylamino group having 6 to 30 carbon atoms, B represents a condensed aromatic ring group having 10 to 40 carbon atoms, and r represents an integer of 1 to 4.

(B) Green Emitting Layer

The green emitting layer contains a host material and a green dopant.

It is preferred to use, as the host material, the same host material used in the blue emitting layer.

The dopant is not particularly limited, and, for example, the following can be used: coumalin derivatives disclosed in EP-A-0281381, JP-A-2003-249372, and others; and aromatic amine derivatives wherein a substituted anthracene structure and an amine structure are linked to each other.

(C) Orange-Red Emitting Layer

An orange-red emitting layer contains a host material and an orange-red dopant.

It is preferred to use, as the host material, the same host material used in the blue emitting layer.

As the dopant, there can be used a fluorescent compound having at least one fluoranthene skeleton or perylene skeleton, for example, the following formula:

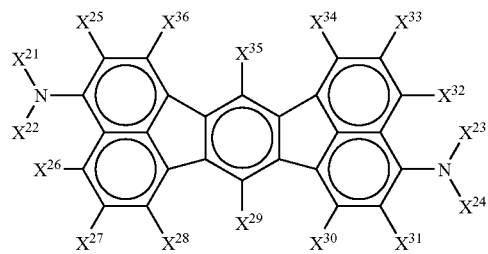

wherein $X^{21}$ through $X^{24}$ each independently represents an alkyl group having 1 to 20 carbon atoms, or a substituted or unsubstituted aryl group having 6 to 30 carbon atoms, and $X^{21}$ and $X^{22}$ and/or $X^{23}$ and $X^{24}$ may be bonded to each other through a carbon-carbon bond, —O—, or —S—; and $X^{25}$ through $X^{36}$ are each a hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms, or a substituted or unsubstituted alkenyl group having 8 to 30 carbon atoms, and adjacent groups of the substituents, and $X^{25}$ through $X^{36}$ may be bonded so as to form a cyclic structure. It is preferred that at least one of $X^{25}$ through $X^{36}$ in each of the formulae contains an amine or alkenyl group.

3. Light Diffusive Member

In a structure wherein two reflection surfaces are formed and further the FWHM of the EL spectrum is made more narrow than the natural emission bandwidth of the emission center, radiation tends to concentrate forward (in the direction of the normal line of its emission surface). The light diffusive member should relieve such concentration in the forward direction, and a known member can be used. For example, the following member can be used:

1) A member wherein beads having particle diameters similar to the wavelengths of visible rays (the material thereof being any material that is transparent) are arranged on a surface of a substrate.

2) An array of micro-lenses arranged at a pitch of several tens of micrometers. The shape of the micro-lenses can be selected from a cone, a tetrahedron, a quadrangular pyramid, and so on.

3) A member wherein silica aero gel having a low refractive index is in a lamellar form.

Example 1

An organic EL apparatus was fabricated wherein first emitting devices exhibiting blue, second emitting devices exhibiting green, and third emitting devices exhibiting red, were placed on a planar surface of a glass substrate of 0.7 mm thickness. The size of the emission screen was 45-mm square. The size of the emission surfaces of the emitting devices was as follows: H=2.0 mm, V=0.4 mm, h=0.25 mm, and v=0.1 mm in FIG. 4. That is, 20 emitting devices were connected in series along the direction of the longer sides of H=2.0 mm.

Structures of compounds used in the devices are illustrated below.

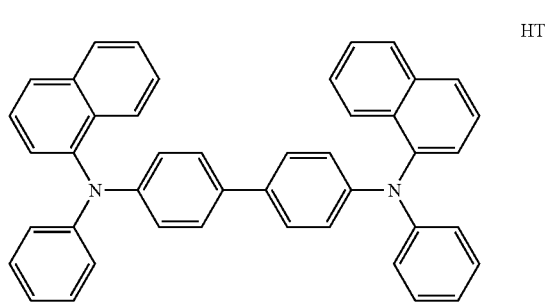

HT

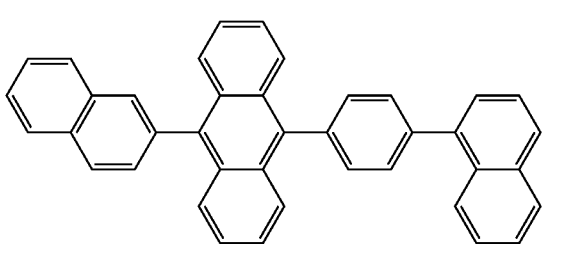

BH

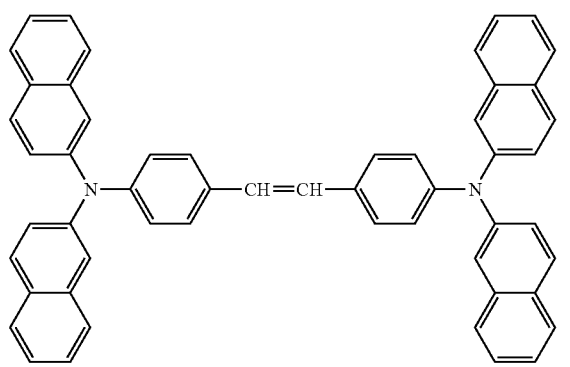

BD

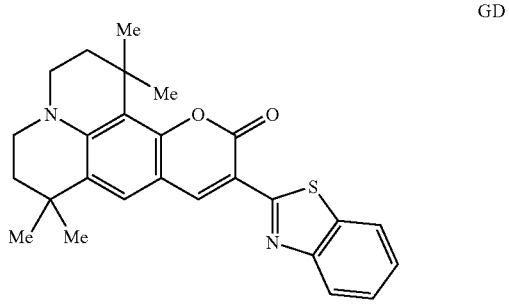

GD

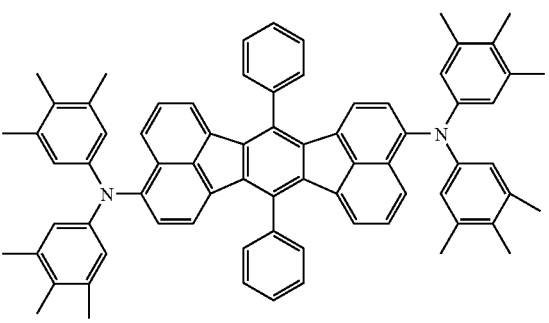

RD

Formation of an Under Electrode Substrate

ITO was formed into an adhesive layer on a glass support substrate of 0.7 mm thickness by sputtering, to give a thickness of 100 nm. Thereafter, Ag was formed into a film by sputtering, to give a thickness of 150 nm. Furthermore, ITO was formed into a film by sputtering, to give a thickness of 10 nm. The under electrode was patterned by photolithography in a ratio of each line to each space in the lateral direction of 2.15/0.10, and a ratio of each line to each space in the longitudinal direction of 0.42/0.08. Furthermore, the result was spin-coated with a acrylic resist (V259PA, manufactured by Nippon Steel Chemical Co., Ltd.), exposed to ultraviolet rays with a photo-mask covering the edge of the under electrode pattern, and developed. The result was further subjected to baking treatment at 180° C., to form an under electrode substrate having an insulating layer.

Preparation of a Vacuum Deposition Apparatus

This under electrode substrate was cleaned with ultrasonic waves in isopropyl alcohol for 5 minutes, and then cleaned with UV ozone for 30 minutes. The cleaned substrate with the under electrode was placed on a substrate holder of a vacuum deposition apparatus.

HT as a hole transporting material, BH as a host material of an emitting medium layer, BD as a blue emitting material, GD as a green emitting material, RD as a red emitting material, LiF as a buffer layer material, and Mg and Ag as light semi-reflective and semi-transparent materials, respectively, were placed on heating boats made of molybdenum. Furthermore, an ITO target was placed, for a light transparent electrode, into another sputtering apparatus.

Fabrication of First Emitting Devices

First, an HT film functioning as a hole-transporting layer was formed to a thickness of 130 nm. After the formation of the HT film, the compounds BH and BD were co-deposited in a thickness ratio of 30:1.5 to form a blue emitting layer of 30 nm thickness. An $Alq_3$ film was formed, as an electron-transporting layer, to a thickness of 20 nm on the above-mentioned film. Thereafter, LiF was deposited in a buffer layer of 1 nm thickness. A Mg:Ag film functioning as a light semi-reflective and semi-transparent layer was deposited to a thickness of 10 nm on the above-mentioned film at a film-forming speed ratio of Mg to Ag of 9:1. ITO functioning as a light transparent electrode was further formed to a film of 100 nm thickness.

Fabrication of Second Emitting Devices

First, an HT film functioning as a hole-transporting layer was formed to a thickness of 170 nm. After the formation of the HT film, the compounds BH and GD were co-deposited in a thickness ratio of 30:0.4 to form a green emitting layer of 30 nm thickness. An $Alq_3$ film was formed, as an electron-transporting layer, to a thickness of 20 nm on the above-mentioned film. Thereafter, LiF was deposited in a buffer layer of 1 nm thickness. A Mg:Ag film functioning as a light semi-reflective and semi-transparent layer was deposited into a thickness of 10 nm on the above-mentioned film at a film-forming speed ratio of Mg to Ag of 9:1. ITO functioning as a light transparent electrode was further formed in a film of 100 nm thickness wherein the ITO was connected to the under electrodes of the first emitting devices.

Fabrication of Third Emitting Devices

First, an HT film functioning as a hole-transporting layer was formed to a thickness of 60 nm. After the formation of the HT film, the compounds BH and RD were co-deposited in a thickness ratio of 30:1.5 to form a green emitting layer of 30 nm thickness. An $Alq_3$ film was formed, as an electron-transporting layer, to a thickness of 20 nm on the above-mentioned film. Thereafter, LiF was deposited in a buffer layer of 1 nm thickness. A Mg:Ag film functioning as a light semi-reflective and semi-transparent layer was deposited to a thickness of 10 nm on the above-mentioned film at a film-forming speed ratio of Mg to Ag of 9:1. ITO functioning as a light transparent electrode was further formed in a film of 100 nm thickness wherein the ITO was connected to the under electrodes of the second emitting devices. In this way, an organic EL apparatus was obtained.

Evaluation of the Organic EL Apparatus

Electric current was applied to terminals of the organic EL apparatus. As a result, light was emitted from the entire surface thereof. When the luminance was adjusted to 1000 $cd/m^2$, the current density flowing to each of the emitting devices was 7.9 $mA/cm^2$. The total driving voltage was 81 V. The light was white light having a chromaticity of (0.314, 0.356). The current efficiency was 17.8 cd/A, and the power efficiency was 13.91 m/W.

INDUSTRIAL APPLICABILITY

The organic EL apparatus of the invention can be used for backlighting a liquid crystal display, illumination for decoration, ordinary indoor illumination, or the like.

What is claimed is:

1. An organic electroluminescent apparatus comprising:
a first emitting device wherein a first organic emitting layer is between a first under electrode and a first upper electrode, the first emitting device comprising insulating layers having different heights on both sides of the first under electrode to insulate the first under electrode from the first upper electrode; and
a second emitting device wherein a second organic emitting layer is between a second under electrode and a second upper electrode, the second emitting device comprising insulating layers having different heights on both sides of the second under electrode to insulate the second under electrode from the second upper electrode, and the second upper electrode being electrically connected to the first under electrode or being made of the same material as the material of the first under electrode;
at least one of the emitting devices comprising a light diffusive member through which light is emitted from the apparatus, the light diffusive member being able to relieve radiation into an isotropic radiation pattern without the loss of optical intensity;
the first and second emitting devices being substantially coplanar; and
the first and second emitting devices exhibiting different emission colors;
wherein at least one of the emitting devices has two reflection surfaces,
at least one of the reflection surfaces is semi-reflective and semi-transparent,
the organic emitting layer is between the two optical reflection interfaces, and
the distance between the two optical reflection interfaces is set to narrow the natural emission bandwidth of light emitted from the emission center in the organic emitting layer.

2. The organic electroluminescent apparatus according to claim 1, wherein one of the insulating layers of the first emitting device is higher than the first upper electrode, and one of the insulating layers of the second emitting device is higher than the second upper electrode.

3. An organic electroluminescent apparatus comprising:
a first emitting device wherein a first organic emitting layer is between a first under electrode and a first upper electrode, the first emitting device comprising insulating layers having different heights on both sides of the first under electrode to insulate the first under electrode from the first upper electrode;
a second emitting device wherein a second organic emitting layer is between a second under electrode and a second upper electrode, the second emitting device comprising insulating layers having different heights on both sides of the second under electrode to insulate the second under electrode from the second upper electrode, and the second upper electrode being electrically connected to the first under electrode or being made of the same material as the material of the first under electrode; and
a third emitting device wherein a third organic emitting layer is between a third under electrode and a third upper electrode, the third emitting device comprising insulating layers having different heights on both sides of the third under electrode to insulate the third under electrode from the third upper electrode, and the third upper electrode being electrically connected to the second under electrode or being made of the same material as the material of the first under electrode;
at least one of the emitting devices comprising a light diffusive member through which light is emitted from the apparatus, the light diffusive member being able to relieve radiation into an isotropic radiation pattern without the loss of optical intensity;
the first, second and third emitting devices being substantially coplanar; and
the first, second and third emitting devices exhibiting two or more different emission colors;
wherein at least one of the emitting devices has two reflection surfaces,
at least one of the reflection surfaces is semi-reflective and semi-transparent,
the organic emitting layer is between the two optical reflection interfaces, and
the distance between the two optical reflection interfaces is set to narrow the natural emission bandwidth of light emitted from the emission center in the organic emitting layer.

4. The organic electroluminescent apparatus according to claim 3, wherein one of the insulating layers of the first emitting device is higher than the first upper electrode, one of the insulating layers of the second emitting device is higher than the second upper electrode, and one of the insulating layers of the third emitting device is higher than the third upper electrode.

5. An organic electroluminescent apparatus comprising emitting devices the number of which is N, N being an integer of two or more,
wherein the first emitting device comprises a first organic emitting layer between a first under electrode and a first upper electrode, and insulating layers having different heights on both sides of the first under electrode to insulate the first under electrode from the first upper electrode,
the $(k+1)^{th}$ emitting device, k being an integer of 1 or more and N−1 or less, comprises a $(k+1)^{th}$ organic emitting layer between a $(k+1)^{th}$ under electrode and a $(k+1)^{th}$ upper electrode, and insulating layers having different heights on both sides of $(k+1)^{th}$ under electrode to insulate the $(k+1)^{th}$ under electrode from the $(k+1)^{th}$ upper electrode, the $(k+1)^{th}$ upper electrode being electrically connected to the $k^{th}$ under electrode or being made of the same material as the material of the $k^{th}$ under electrode, and
the $N^{th}$ emitting device comprises a $N^{th}$ organic emitting layer between a $N^{th}$ under electrode and a $N^{th}$ upper electrode, and insulating layers having different heights on both sides of $N^{th}$ under electrode to insulate the $N^{th}$ under electrode from the $N^{th}$ upper electrode, the $N^{th}$ upper electrode being electrically connected to the $(N-1)^{th}$ under electrode or being made of the same material as the material of the $(N-1)^{th}$ under electrode,
at least one of the emitting devices comprising a light diffusive member through which light is emitted from the apparatus, the light diffusive member being able to relieve radiation into an isotropic radiation pattern without the loss of optical intensity;
the N emitting devices are substantially coplanar, and
the N emitting devices exhibit two or more different emission colors;
wherein at least one of the emitting devices has two reflection surfaces,
at least one of the reflection surfaces is semi-reflective and semi-transparent,
the organic emitting layer is between the two optical reflection interfaces, and
the distance between the two optical reflection interfaces is set to narrow the natural emission bandwidth of light emitted from the emission center in the organic emitting layer.

6. The organic electroluminescent apparatus according to claim 5, wherein one of the insulating layers of the first emitting device is higher than the first upper electrode, one of the insulating layers of the $(k+1)^{th}$ emitting device is higher than the $(k+1)^{th}$ upper electrode, and one of the insulating layers of the $N^{th}$ emitting device is higher than the $N^{th}$ upper electrode.

* * * * *